United States Patent
Kuo et al.

(10) Patent No.: US 9,577,686 B2
(45) Date of Patent: Feb. 21, 2017

(54) PROVIDING FOR RADIO FREQUENCY AUTO GAIN CONTROL (RF AGC)

(71) Applicants: Yao H. Kuo, West Bloomfield, MI (US); Christopher John Barranger, Whitmore Lake, MI (US)

(72) Inventors: Yao H. Kuo, West Bloomfield, MI (US); Christopher John Barranger, Whitmore Lake, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 14/694,691

(22) Filed: Apr. 23, 2015

(65) Prior Publication Data

US 2016/0315645 A1 Oct. 27, 2016

(51) Int. Cl.
| | |
|---|---|
| H04B 1/10 | (2006.01) |
| H04B 17/309 | (2015.01) |
| H04B 17/21 | (2015.01) |
| H04B 17/318 | (2015.01) |
| H04B 17/345 | (2015.01) |

(52) U.S. Cl.
CPC ............ *H04B 1/1027* (2013.01); *H04B 17/21* (2015.01); *H04B 17/318* (2015.01); *H04B 17/345* (2015.01); *H04B 2001/1072* (2013.01)

(58) Field of Classification Search
CPC ......... H04B 1/10; H04B 1/1027; H04B 17/00; H04B 17/21; H04B 17/309; H04B 17/318; H04B 17/336; H04B 17/345
USPC ................... 455/232.1, 234.1, 234.2, 245.1, 250.1, 455/254
See application file for complete search history.

(56) References Cited

U.S. PATENT DOCUMENTS

| | | | |
|---|---|---|---|
| 4,776,040 A | 10/1988 | Ichikawa et al. | |
| 5,222,255 A | 6/1993 | Kuo et al. | |
| 5,339,454 A | 8/1994 | Kuo et al. | |
| 6,208,849 B1 * | 3/2001 | Cho ...................... | H04B 1/109 455/296 |
| 7,242,915 B2 * | 7/2007 | Shi ........................... | H03F 1/32 375/345 |
| 7,299,021 B2 * | 11/2007 | P rssinen ............... | H04B 1/109 375/345 |
| 7,379,725 B2 * | 5/2008 | Shi ........................... | H03F 1/32 455/226.2 |
| 2007/0004361 A1 * | 1/2007 | Srinivasan ........... | H03G 3/3068 455/252.1 |

(Continued)

FOREIGN PATENT DOCUMENTS

| | | |
|---|---|---|
| JP | 2014-506746 A | 3/2014 |
| WO | 2012/099932 A1 | 7/2012 |

*Primary Examiner* — Blane Jackson
(74) *Attorney, Agent, or Firm* — Dickinson Wright PLLC (57) ABSTRACT

A method and system for providing radio frequency auto gain control (RF AGC) for a specific frequency is provided herein. The method includes obtaining a noise measurement (N) and radio frequency level for the specific frequency; scanning a band of frequencies that the specific frequency is part of, and storing a plurality of undesired frequencies; computing a frequency intermodulation up to a predetermined level based on the plurality of undesired frequencies; and in response to the frequency intermodulation being not equal to the specific frequency, performing an iterative process to readjust the RF AGC, the iterative process including a readjustment of the RF AGC based on a noise floor performance.

7 Claims, 8 Drawing Sheets

(56) References Cited

U.S. PATENT DOCUMENTS

2011/0228171 A1* 9/2011 Bhat ..................... H03F 1/0272
348/731

* cited by examiner

3rd ORDER IM CALCULATION EXAMPLES (SOUTHFIELD, MICHIGAN)

| NORMALIZED RF LEVEL | MHz | 93.1 | 94.7 | 95.5 | 96.3 | 97.1 | 99.5 | 101.1 | 105.1 | 105.9 |
|---|---|---|---|---|---|---|---|---|---|---|
| 0.721 | 93.1 |  | 91.5 | 90.7 | 89.9 | 89.1 | 86.7 | 85.1 | 81.1 | 80.3 |
| 0.66 | 94.7 | 96.3 |  | 93.9 | 93.1 | 92.3 | 89.9 | 88.3 | 84.3 | 83.5 |
| 0.791 | 95.5 | 97.9 | 96.3 |  | 94.7 | 93.9 | 91.5 | 89.9 | 85.9 | 85.1 |
| 0.711 | 96.3 | 99.5 | 97.9 | 97.1 |  | 95.5 | 93.1 | 91.5 | 87.5 | 86.7 |
| 0.721 | 97.1 | 101.1 | 99.5 | 98.7 | 97.9 |  | 94.7 | 93.1 | 89.1 | 88.3 |
| 0.682 | 99.5 | 105.9 | 104.3 | 103.5 | 102.7 | 101.9 |  | 97.7 | 93.9 | 93.1 |
| 0.591 | 101.1 | 109.1 | 107.5 | 106.7 | 105.9 | 105.1 | 102.7 |  | 97.1 | 96.3 |
| 0.577 | 105.1 | 117.1 | 115.5 | 114.7 | 113.9 | 113.1 | 110.7 | 109.1 |  | 104.3 |
| 0.746 | 105.9 | 118.7 | 117.1 | 116.3 | 115.5 | 114.7 | 112.3 | 110.7 | 106.7 |  |

[TABLE 1]: POSSIBLE 3rd ORDER INTERMODULATION FREQUENCIES

FIG. 6A

5th ORDER IM CALCULATION EXAMPLES (SOUTHFIELD, MICHIGAN)

| NORMALIZED RF LEVEL | MHz | 93.1 | 94.7 | 95.5 | 96.3 | 97.1 | 99.5 | 101.1 | 105.1 | 105.9 |
|---|---|---|---|---|---|---|---|---|---|---|
| 0.721 | 93.1 | | 89.9 | 88.3 | 86.7 | 85.1 | 80.3 | 77.1 | 69.1 | 67.5 |
| 0.66 | 94.7 | 97.9 | | 93.1 | 91.5 | 89.9 | 85.1 | 81.9 | 73.9 | 72.3 |
| 0.791 | 95.5 | 100.3 | 97.1 | | 93.9 | 92.3 | 87.5 | 84.3 | 76.3 | 74.7 |
| 0.711 | 96.3 | 102.7 | 99.5 | 97.9 | | 94.7 | 89.9 | 86.7 | 78.7 | 77.1 |
| 0.721 | 97.1 | 105.1 | 101.9 | 100.3 | 98.7 | | 92.3 | 89.1 | 81.1 | 79.5 |
| 0.682 | 99.5 | 112.3 | 109.1 | 107.5 | 105.9 | 104.3 | | 96.3 | 88.3 | 86.7 |
| 0.591 | 101.1 | 117.1 | 113.9 | 112.3 | 110.7 | 109.1 | 104.3 | | 93.1 | 91.5 |
| 0.577 | 105.1 | 129.1 | 125.9 | 124.3 | 122.7 | 121.1 | 116.3 | 113.1 | | 103.5 |
| 0.746 | 105.9 | 131.5 | 128.3 | 126.7 | 125.1 | 123.5 | 118.7 | 115.5 | 107.5 | |

[TABLE 2]: POSSIBLE 5th ORDER INTERMODULATION FREQUENCIES

*FIG. 6B*

7th ORDER IM CALCULATION EXAMPLES (SOUTHFIELD, MICHIGAN)

| NORMALIZED RF LEVEL | MHz | 93.1 | 94.7 | 95.5 | 96.3 | 97.1 | 99.5 | 101.1 | 105.1 | 105.9 |
|---|---|---|---|---|---|---|---|---|---|---|
| 0.721 | 93.1 |  | 88.3 | 85.9 | 83.5 | 81.1 | 73.9 | 69.1 | 57.1 | 54.7 |
| 0.66 | 94.7 | 99.5 |  | 92.3 | 89.9 | 87.5 | 80.3 | 75.5 | 63.5 | 61.1 |
| 0.791 | 95.5 | 102.7 | 97.9 |  | 93.1 | 90.7 | 83.5 | 78.7 | 66.7 | 64.3 |
| 0.711 | 96.3 | 105.9 | 101.1 | 98.7 |  | 93.9 | 86.7 | 81.9 | 69.9 | 67.5 |
| 0.721 | 97.1 | 109.1 | 104.3 | 101.9 | 99.5 |  | 89.9 | 85.1 | 73.1 | 70.7 |
| 0.682 | 99.5 | 118.7 | 113.9 | 111.5 | 109.1 | 106.7 |  | 94.7 | 82.7 | 80.3 |
| 0.591 | 101.1 | 125.1 | 120.3 | 117.9 | 115.5 | 113.1 | 105.9 |  | 89.1 | 86.7 |
| 0.577 | 105.1 | 141.1 | 136.3 | 133.9 | 131.5 | 129.1 | 121.9 | 117.1 |  | 102.7 |
| 0.746 | 105.9 | 144.3 | 139.5 | 137.1 | 134.7 | 132.3 | 125.1 | 120.3 | 108.3 |  |

[TABLE 3]: POSSIBLE 7th ORDER INTERMODULATION FREQUENCIES

*FIG. 6C*

PROVIDING FOR RADIO FREQUENCY AUTO GAIN CONTROL (RF AGC)

BACKGROUND

Electronic devices, such as radios and other receiving electronic systems, are configured to receive signals via radio waves. The radio waves are propagated via different frequencies. Each frequency may correspond to a specific channel or source of information. In a vehicle, the electronic device may be provided with a radio frequency (RF) receiver, and in response to a specific RF being tuned to, the RF receiver may be configured to receive the signal associated with radio waves of the specific RF frequency.

Various digital signal processing (DSP) techniques may be employed by the RF receiver to improve and augment the signal being received. One such element is a radio frequency auto gain control (RF AGC) circuit or device. The RF AGC prevents the received antenna signals from overloading a front-end circuit. An overloading of a front-end circuit is caused by a signal over a specific amount being received at an input end of the RF receiver. The signal may be received from either the intended signal to be received (the frequency being tuned into) or a non-intended signal being received (another frequency).

Conventional RF AGC's address this issue by reducing a gain and/or sensitivity over the whole band. A band is all the available frequencies capable of being tuned into via a RF receiver. By doing this, the overall sensitivity (i.e. the ability to pick up signals) by a RF receiver is reduced. This phenomenon is labeled as desensitization.

This desensitization may cause problems with overall reception. For example, if the RF receiver is tuned into a specific frequency that is relatively weak, the desensitization may cause the signal's strength to reduce to a level that is not acceptable.

Figure 1:
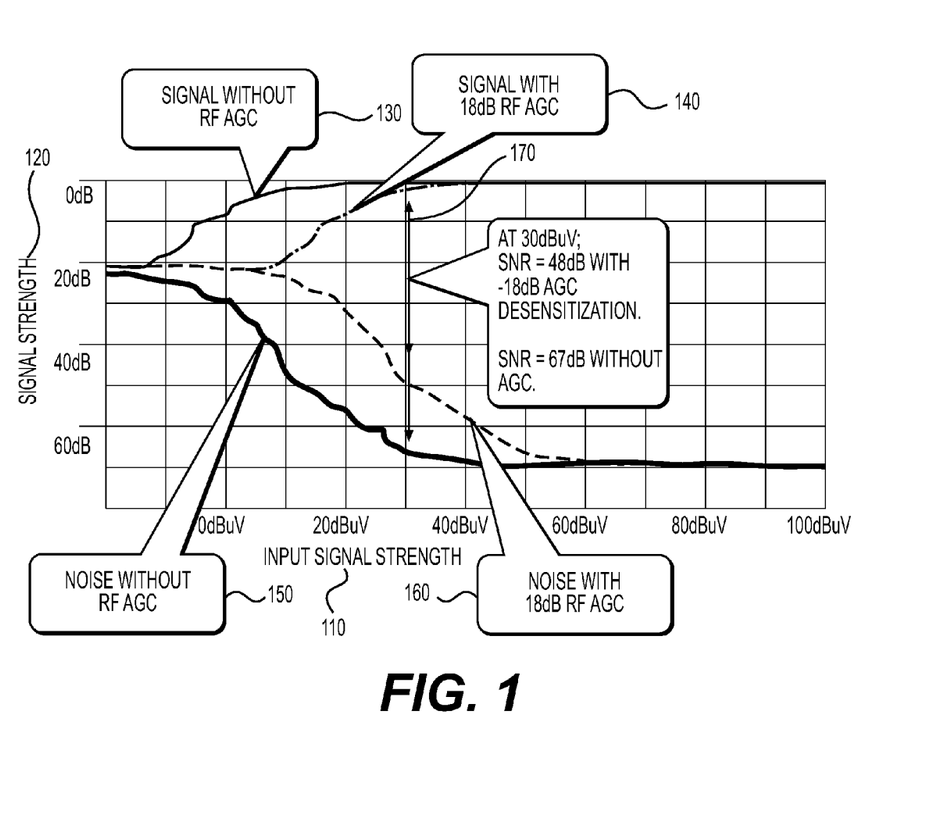
FIG. 1 illustrates an example graph explaining desensitization that may occur due to existing RF AGC implementations.

FIG. 1 illustrates an example graph 100 explaining phenomena explained above. The x-axis 110 shows an input RF signal strength, and the y-axis 120 shows audio output signal strength. Several signals are shown, such as a signal without RF AGC 130, and a signal with 18 decibels of RF AGC 140. Further, the noise is plotted for both, so the noise is plotted with the signal without RF AGC 150 and the noise for the signal with 18 dB RF AGC 160.

As shown in point 170, the signal-to-noise (SNR) ratio is 48 dB for the case of a signal with RF AGC and 67 dB in the case without RF AGC. This graph 100 illustrates that as the signal gets weaker, the noise floor (i.e. noise signal 160) goes higher. Thus, with a larger SNR, the signal 120 is less likely to provide an effective quality rate required to provide certain services (such as high definition radio).

Figure 2:
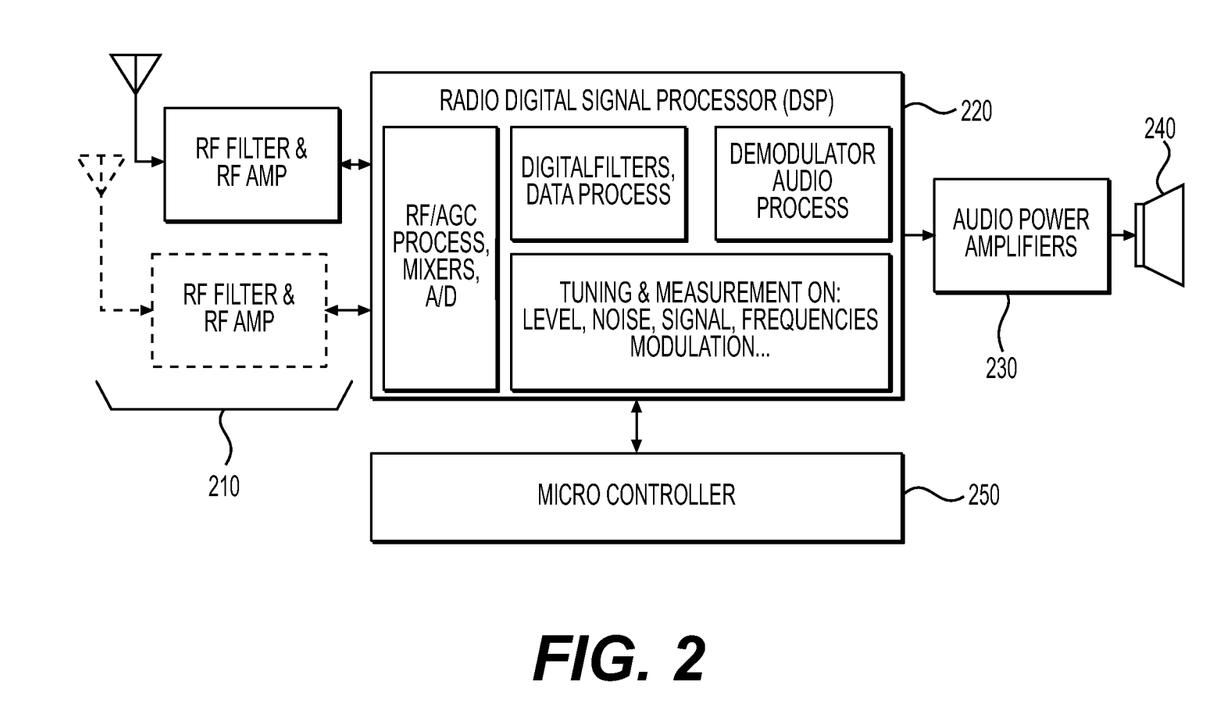
FIG. 2 illustrates an example of a single and dual-tuner receiver according to a conventional implementation.

FIG. 2 illustrates an example of a single and dual-tuner receiver 200 according to a conventional implementation. The receiver 200 includes an input stage 210, a digital signal processor (DSP) 220, an audio power amplifier 230, a microcontroller 240, and a speaker 250. Due to this receiver 200 being known in the art, a detailed explanation will be omitted. Essentially, a DSP may implement an improvement of signal strength and quality by including various chipsets dedicated to providing AGC.

SUMMARY

The following description relates to systems and methods for providing radio frequency auto gain control (RF AGC). Exemplary embodiments may also be directed to any of the system, the method, a radio employing the system or method, or combinations thereof.

Additional features of the invention will be set forth in the description which follows, and in part will be apparent from the description, or may be learned by practice of the invention.

A method and system for providing radio frequency auto gain control (RF AGC) for a specific frequency is provided herein. The method includes obtaining a noise measurement (N) and radio frequency level for the specific frequency; scanning a band of frequencies that the specific frequency is part of, and storing a plurality of undesired frequencies; computing a frequency intermodulation up to a predetermined level based on the plurality of undesired frequencies; and in response to the frequency intermodulation being not equal to the specific frequency, performing an iterative process to readjust the RF AGC, the iterative process including a readjustment of the RF AGC based on a noise floor performance.

It is to be understood that both the foregoing general description and the following detailed description are exemplary and explanatory and are intended to provide further explanation of the invention as claimed. Other features and aspects will be apparent from the following detailed description, the drawings, and the claims.

DESCRIPTION OF THE DRAWINGS

The detailed description refers to the following drawings, in which like numerals refer to like items, and in which.

DETAILED DESCRIPTION

The invention is described more fully hereinafter with references to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. It will be understood that for the purposes of this disclosure, "at least one of each" will be interpreted to mean any combination the enumerated elements following the respective language, including combination of multiples of the enumerated elements. For example, "at least one of X, Y, and Z" will be construed to mean X only, Y only, Z only, or any combination of two or more items X, Y, and Z (e.g. XYZ, XZ, YZ, X). Throughout the drawings and the detailed description, unless otherwise described, the same drawing reference numerals are understood to refer to the same elements, features, and structures. The relative size and depiction of these elements may be exaggerated for clarity, illustration, and convenience.

RF receivers receive signals conveying information. The signals are transmitted over various frequencies and over a band. A band is a listing or set of available frequencies associated with stations that a RF receiver is capable of receiving.

As explained in the Background section, in response to a specific station being tuned into, the specific station may experience interference from other frequencies. Thus, if the other frequencies are strong enough, they may affect the quality of the received frequency's signal. This leads to interference and other deleterious effects.

RF AGC has been proposed as a technique for reducing these issues. However, as explained in the Background section, the RF AGC leads to a phenomenon known as desensitization. Desensitization causes all the frequencies over a band to reduce in signal strength. Thus, as shown in the example cited in FIG. 1, the signal may be affected more by noise related issues.

Disclosed herein are methods, systems, and devices to minimize desensitization associated with an RF AGC solution. The RF AGC solution may be incorporated into the various elements shown in FIG. 2 to provide digital signal processing (DSP) to incoming RF signals, thereby allowing for the reduction of interference from strong signals with the overall desensitization lessened.

Figure 3:
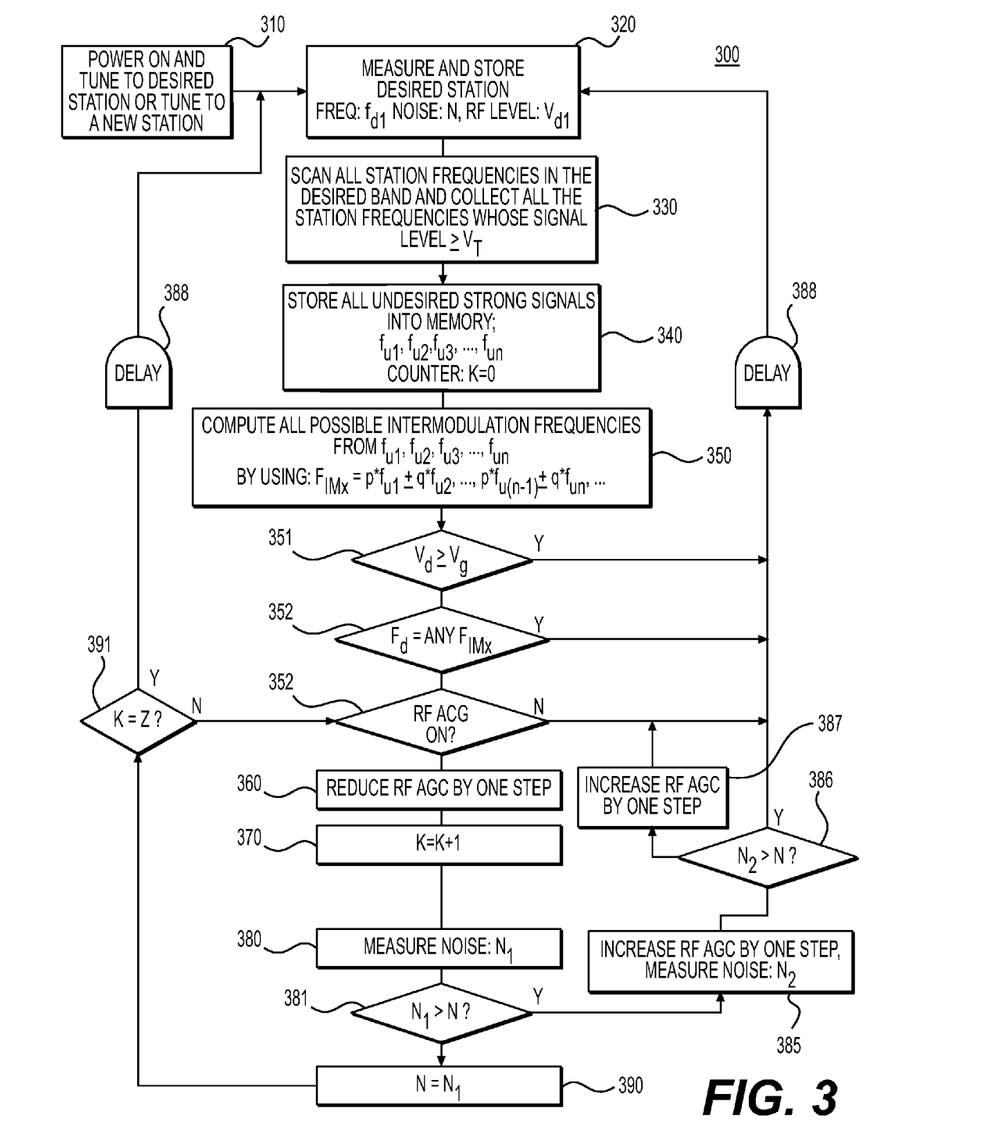
FIG. 3 illustrates an example of a method for providing a radio frequency auto gain control (RF AGC).

FIG. 3 illustrates an example of a method 300 for providing a radio frequency auto gain control (RF AGC). The method 300 may be implemented on a processor, such as DSP 220 shown above. The DSP 220 may be re-engineered (i.e. the circuits may be reconfigured) in a manner to provide the functionality associated with method 300.

In operation 310, a detection of a tuning to a specific RF frequency (or station) is detected. This may occur after a radio is turned on, or by a user or operator of the radio tuning the radio to a specific RF frequency.

In operation 320, the tuned into RF frequency undergoes a variety of measurements. The measurements are subsequently stored into a memory register. The properties recorded are the frequency ($f_d$), noise (N), and the RF level ($V_d$). The frequency is the specific frequency being tuned into. The noise is the noise that the specific frequency is subject to. The RF level refers to the strength of the signal received at the specific frequency.

In operation 330, a scanning and recordation of signal strength for all the frequencies of a band which contains the $f_d$ of operation 320 is performed. A predetermined threshold ($V_T$) may be set at this juncture, with all the frequencies in the scanned operation over the $V_T$ being recorded. In operation 340, the identified frequencies may be stored in memory, and each labeled as such ($f_{u1}, f_{u2}, f_{u3}, \ldots, f_{un}$). At this juncture, a counter K may be set at 0. The iteration of this counter at further operation in method 300 will be explained in greater detail below.

Figure 4:
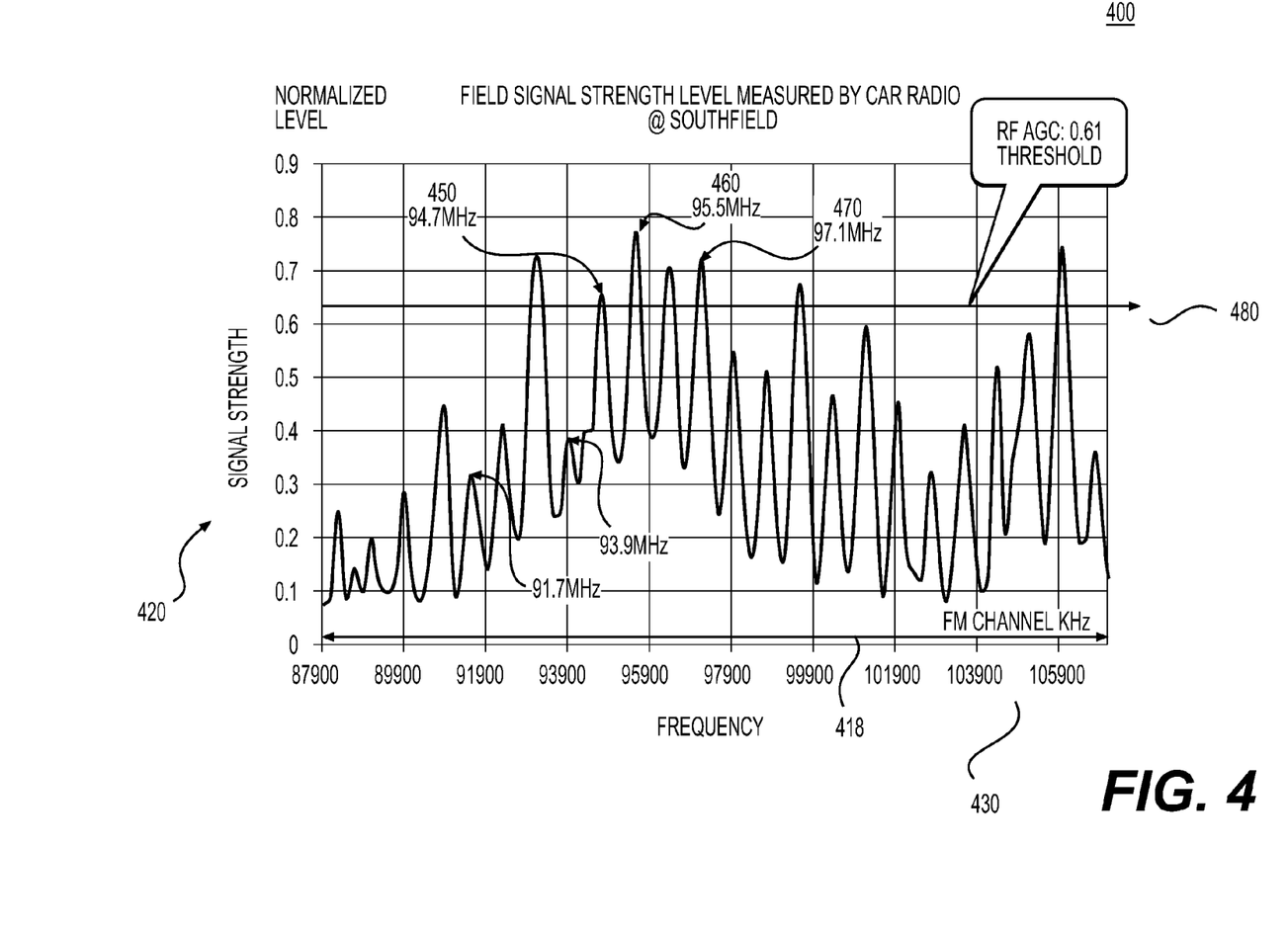
FIG. 4 illustrates an example of a graph 400 of scanned frequencies for a band.

FIG. 4 illustrates an example of a graph 400 of scanned frequencies for a band 410. The x-axis 420 indicates a normalized level of field signal strength associated with each frequency over a band. The y-axis 430 indicates the frequencies over the band 410.

As shown in FIG. 4, the stations 94.7 MHz (450), 95.5 MHz (460), and 97.1 MHz (470) are over a specific threshold 480. The specific threshold 480 may be set by an implementer of method 300. Thus, in the example shown in graph 400, the three frequencies identified above (450, 460, and 470) are stored as $f_{u1}, f_{u2}, f_{u3}$, respectively.

In operation 350, each of the intermodulation and harmonic frequencies are calculated from each of the identified frequencies ($f_{u1}, f_{u2}, f_{u3}, \ldots, f_{un}$). The calculation of various orders of intermodulation frequencies are performed via the following operation:

$f_{im2} = f_{u1} +$ or $-f_{u2}$, where $f_{im2}$ is a $2^{nd}$ order intermodulation frequency.

The $2^{nd}$ order harmonic frequency is just a multiplication of the undesired frequency (i.e $f_{u1}$ and $f_{u2}$) multiplied by two:

$f_{h2} = 2*f_{u1}$ and $2*f_{u2}$, where $F_{h2}$ is a second level harmonics

An example will be illustrated of the calculated intermodulation and harmonic frequencies for a specific test case. In a specific example:

$f_{u1}$ is 101 Mhz; and
$f_{u2}$ is 102 Mhz.
In the example of a FM band:
$2^{nd}$ harmonics: Fh2=202 MHz and 204 MHz
(these frequencies are not inside the FM band)
$f_{im3}$=202−102=100 MHz and 204−101=103 MHz
$f_{im3}$=200+101=301 MHz and 202+100=302 MHz
(these frequencies are not inside the FM band)
5th order intermodulation frequencies:
$f_{im5} = 3*f_{u1} \pm 2*f_{u2}$ or/and $3*f_{u2} \pm 2*f_{u1}$
Using the examples above:
$f_{im5}$=303−204=99 MHz and 306−202=104 MHz
(these IM frequencies are inside FM band)
$f_{im5}$=303+204=507 MHz and 306+202=508 MHz
(these IM frequencies are not inside FM band)
7th order intermodulation frequencies:
$f_{im7} = 4*f_{u1} \pm 3*f_{u2}$ or/and $4*f_{u2} \pm 3*f_{u1}$
$f_{im7}$=404−306=98 MHz and 408−303=104 MHz
(these IM frequencies are inside FM band)
$f_{im7}$=404+306=710 MHz and 408+303=711 MHz.
(these IM frequencies are not inside FM band)

Figure 5:
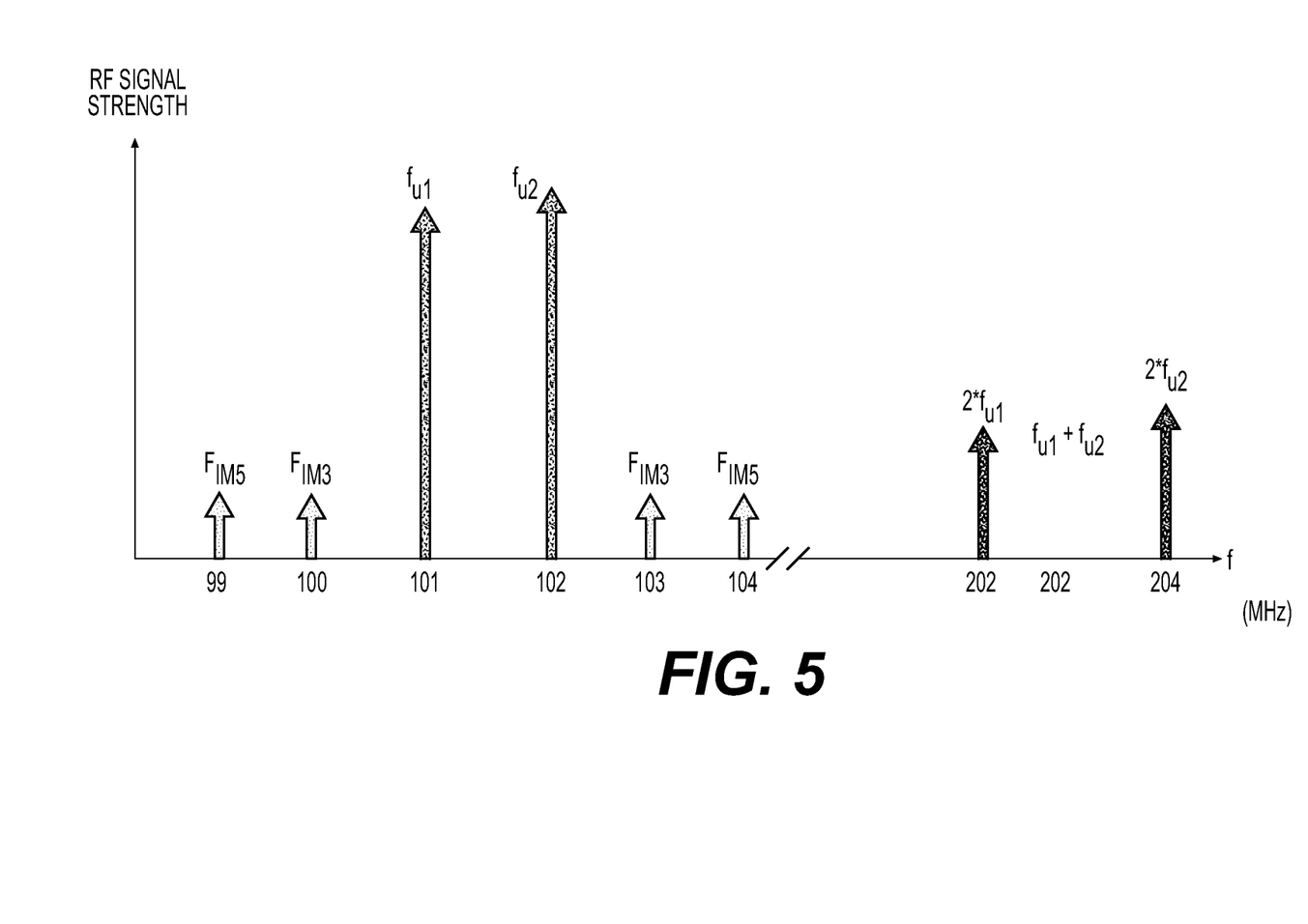
FIG. 5 illustrates an example graph 500 of the various values above for the example used where the intermodulated frequencies are within the FM band.

FIG. 5 illustrates an example graph 500 of the various values above for the example used where the intermodulated frequencies are within the FM band. Further, the various RF signal strengths associated with each intermodulated signal is also shown and measured.

In operation 351, a determination is made as to whether the $V_d$ is above a predetermined threshold ($V_g$). If yes, the need for an RF AGC is obviated. Thus, the method 300 proceeds to operation 388, where a delay occurs. The delay 388 delays a re-check of the present station, where method 300 may be iteratively performed again.

If no, the method 300 proceeds to operation 352. In operation 352, a determination is performed as to whether $f_d$ equals any of the frequency intermodulations calculated in operation 350. If yes, the method 300 once again proceeds to delay 388. If no, the method 300 proceeds operation 353.

In operation 353, a determination is done as to whether RF AGC is requested to be turned on. Operation 353 may be omitted in some implementations of method 300. If the RF AGC is configured to be ON, the method 300 proceeds to operation 360. If the RF AGC is configured to be OFF, the method 300 proceeds to delay 388.

In operation 360, The RF AGC is reduced by a step. Each step is a predetermined amount of RF AGC performed on the radio receiver. The step may be set by an implementer of the method 300.

In operation 370, the value of K is iterated by one. In operation 380, a noise measurement is made (and set as $N_1$). In operation 381, the value of $N_1$ is compared versus N (the value obtained in operation 320). If the determination is that $N_1$ is bigger, the method 300 proceeds to operation 385, and if the determination is that it is not, the method 300 proceeds to operation 390.

In operation 390, the value of N is reassigned and set to $N_1$, and unless K has reached a predetermined limit Z (which is checked in operation 391), the setting of the RF AGC is iteratively performed by a return to operation 353. If the limit has been reached, the method 300 once again returns to delay 388.

If the determination in operation 381 is yes, the method 300 proceeds to operation 385. In operation 385, the opposite of operation 360 is performed, and the step associated with the RF AGC is increased by one. Noise is measured and assigned to $N_2$.

In operation 386, $N_2$ is compared against N. If $N_2$ is bigger, the method 300 proceeds to delay 388. If $N_2$ is not bigger, the method 300 proceeds to operation 387. In operation 387, the RF AGC is increased by one more step, and the method 300 proceeds to delay 388 once again.

Thus employing the aspects disclosed above, the RF AGC may effectively be adjusted in a manner that reduces noise.

Figure 6A:
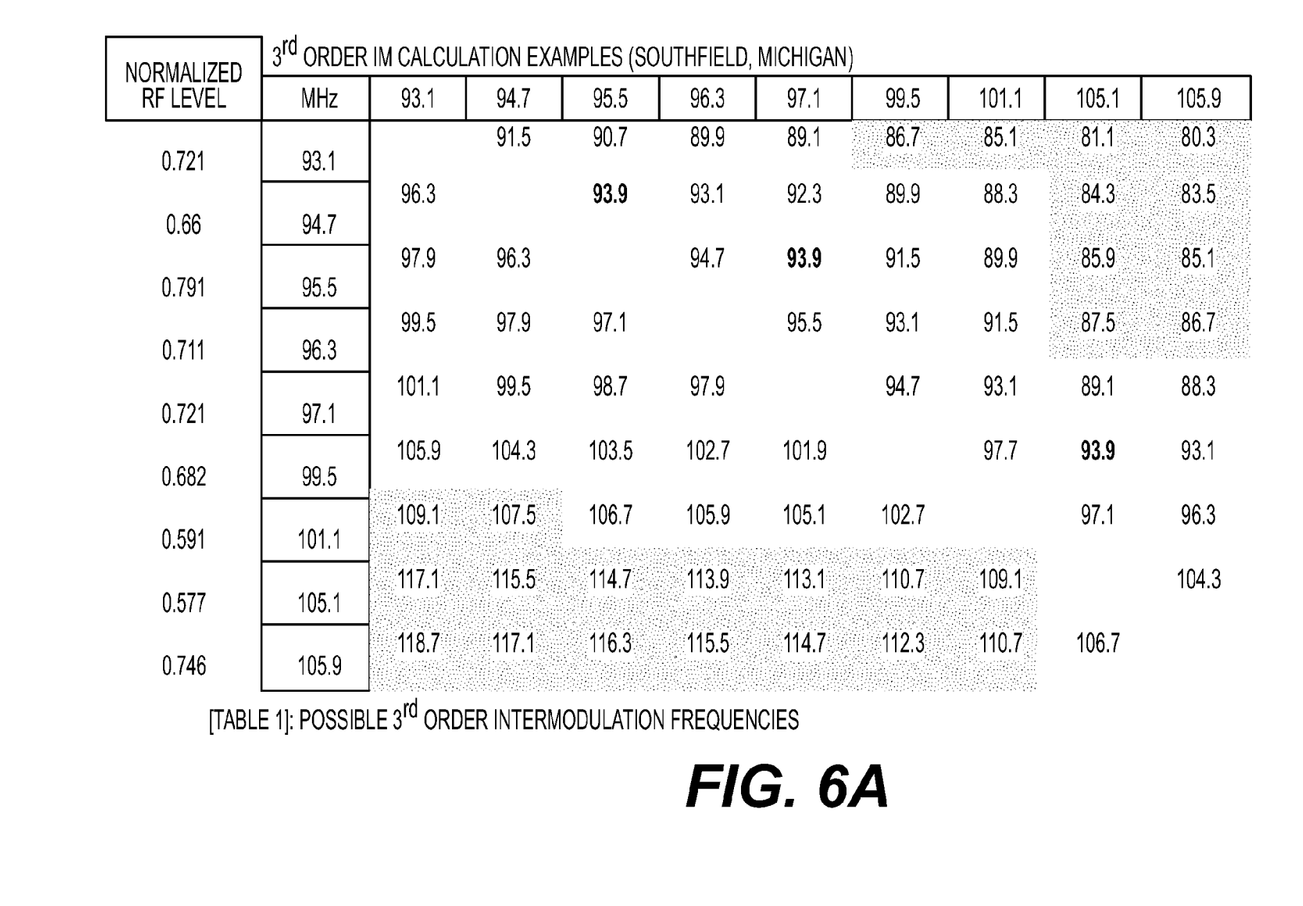
FIGS. 6(a)-(c) illustrate examples of an implementation of the method shown in FIG. 3 according to the aspects disclosed herein.
Figure 6B:
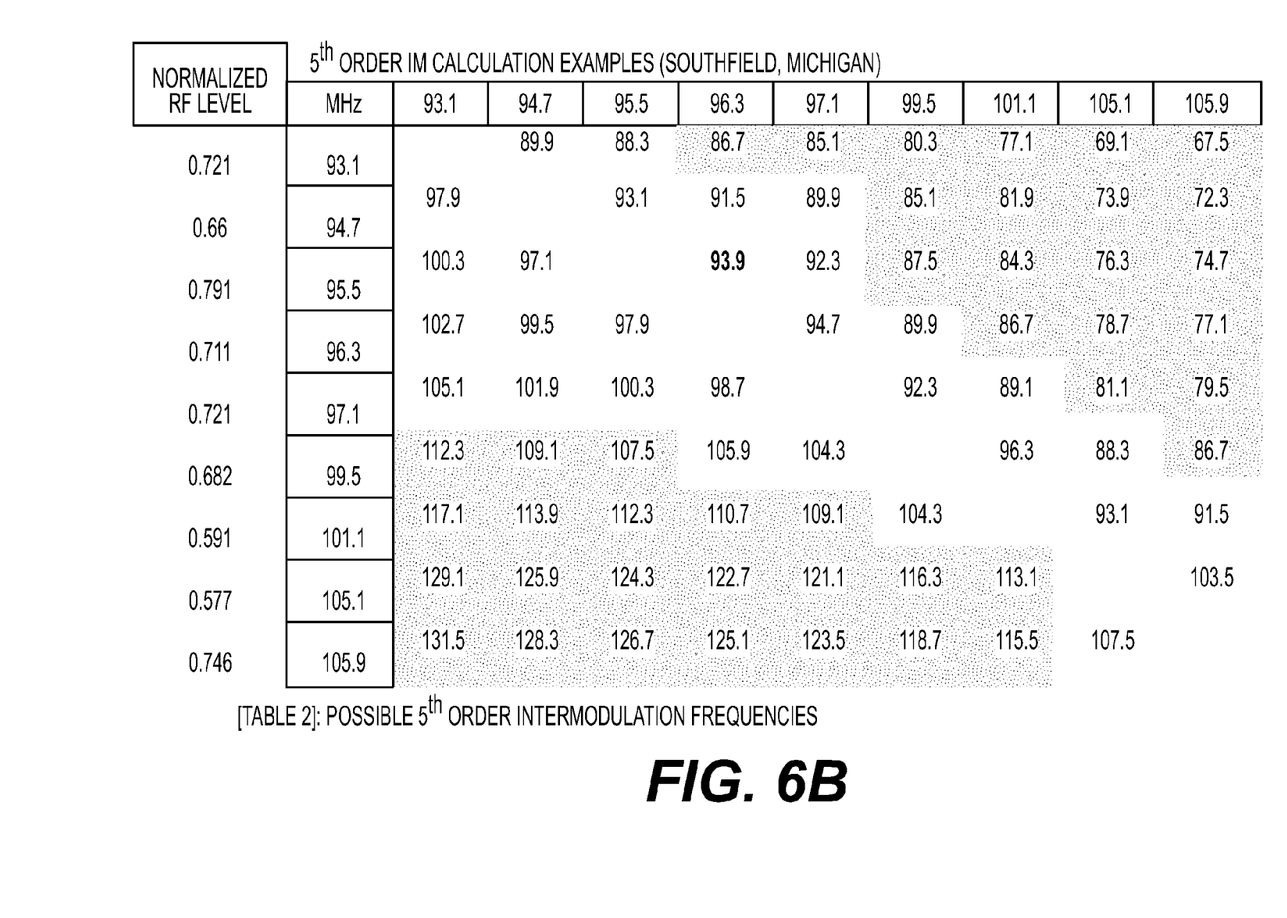
Figure 6C:
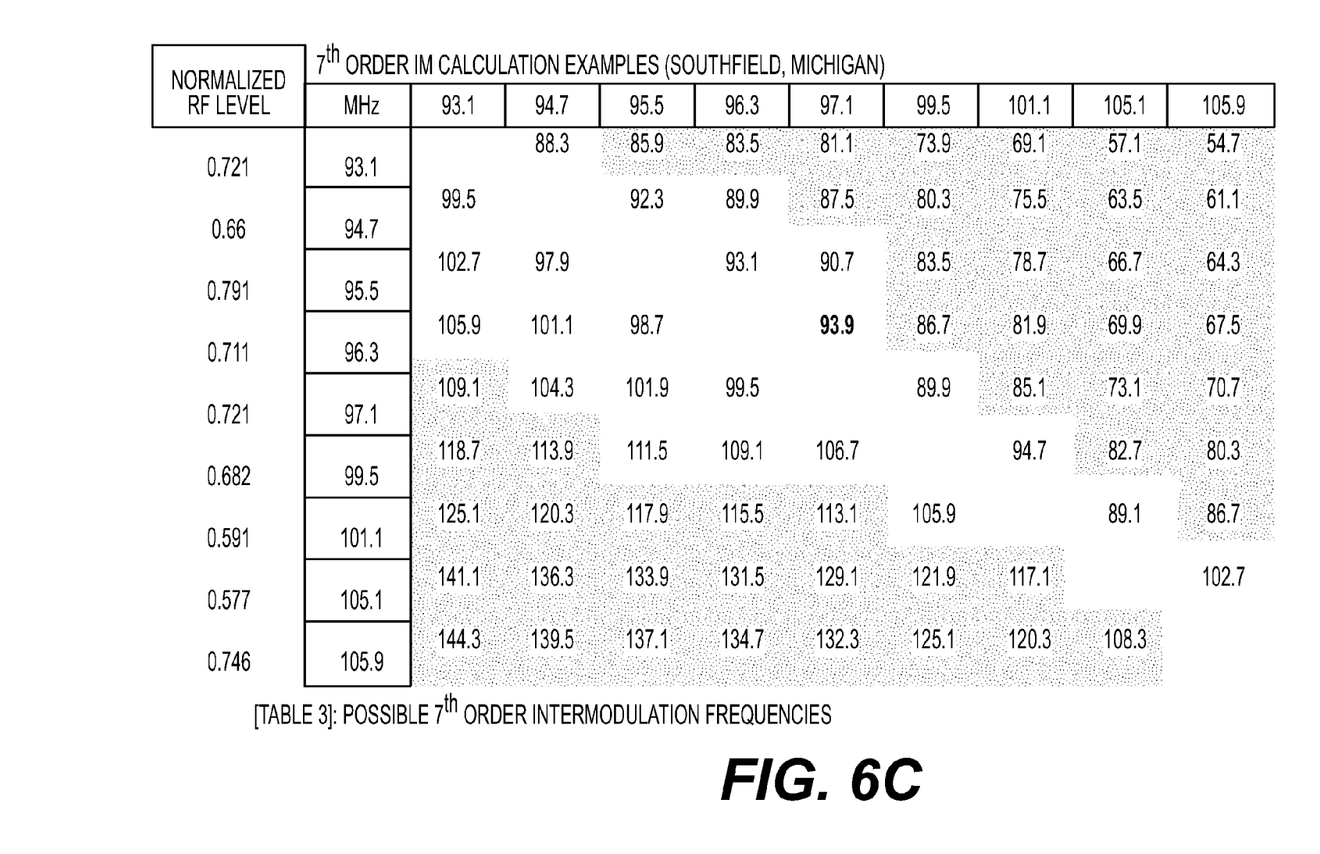

FIGS. 6(a)-(c) illustrate an example implementation of the method 300 employed in a sample band. As shown, various specific radio frequencies are shown. As shown, each specific frequency may be applied a specific RF AGC level. Thus, employing the concepts disclosed herein, a specific RF AGC may be provided for each station in a manner that optimizes a reduction in noise floor.

Certain of the devices shown in FIG. 1 include a computing system. The computing system includes a processor (CPU) and a system bus that couples various system components including a system memory such as read only memory (ROM) and random access memory (RAM), to the processor. Other system memory may be available for use as well. The computing system may include more than one processor or a group or cluster of computing system networked together to provide greater processing capability. The system bus may be any of several types of bus structures including a memory bus or memory controller, a peripheral bus, and a local bus using any of a variety of bus architectures. A basic input/output (BIOS) stored in the ROM or the like, may provide basic routines that help to transfer information between elements within the computing system, such as during start-up. The computing system further includes data stores, which maintain a database according to known database management systems. The data stores may be embodied in many forms, such as a hard disk drive, a magnetic disk drive, an optical disk drive, tape drive, or another type of computer readable media which can store data that are accessible by the processor, such as magnetic cassettes, flash memory cards, digital versatile disks, cartridges, random access memories (RAMs) and, read only memory (ROM). The data stores may be connected to the system bus by a drive interface. The data stores provide nonvolatile storage of computer readable instructions, data structures, program modules and other data for the computing system.

To enable human (and in some instances, machine) user interaction, the computing system may include an input device, such as a microphone for speech and audio, a touch sensitive screen for gesture or graphical input, keyboard, mouse, motion input, and so forth. An output device can include one or more of a number of output mechanisms. In some instances, multimodal systems enable a user to provide multiple types of input to communicate with the computing system. A communications interface generally enables the computing device system to communicate with one or more other computing devices using various communication and network protocols.

The preceding disclosure refers to a number of flow charts and accompanying descriptions to illustrate the embodiments represented in FIG. 3. The disclosed devices, components, and systems contemplate using or implementing any suitable technique for performing the steps illustrated in these figures. Thus, FIG. 3 is for illustration purposes only and the described or similar steps may be performed at any appropriate time, including concurrently, individually, or in combination. In addition, many of the steps in these flow charts may take place simultaneously and/or in different orders than as shown and described. Moreover, the disclosed systems may use processes and methods with additional, fewer, and/or different steps.

Embodiments disclosed herein can be implemented in digital electronic circuitry, or in computer software, firmware, or hardware, including the herein disclosed structures and their equivalents. Some embodiments can be implemented as one or more computer programs, i.e., one or more modules of computer program instructions, encoded on a tangible computer storage medium for execution by one or more processors. A computer storage medium can be, or can be included in, a computer-readable storage device, a computer-readable storage substrate, or a random or serial access memory. The computer storage medium can also be, or can be included in, one or more separate tangible components or media such as multiple CDs, disks, or other storage devices. The computer storage medium does not include a transitory signal.

As used herein, the term processor encompasses all kinds of apparatus, devices, and machines for processing data, including by way of example a programmable processor, a computer, a system on a chip, or multiple ones, or combinations, of the foregoing. The processor can include special purpose logic circuitry, e.g., an FPGA (field programmable gate array) or an ASIC (application-specific integrated circuit). The processor also can include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, module, engine, software, software application, script, or code) can be written in any form of programming language, including compiled or interpreted languages, declarative or procedural languages, and the program can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

To provide for interaction with an individual, the herein disclosed embodiments can be implemented using an interactive display, such as a graphical user interface (GUI). Such GUI's may include interactive features such as pop-up or pull-down menus or lists, selection tabs, scannable features, and other features that can receive human inputs.

The computing system disclosed herein can include clients and servers. A client and server are generally remote from each other and typically interact through a communications network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

We claim:

1. A method for providing radio frequency auto gain control (RF AGC) for a specific frequency, comprising:
    obtaining a noise measurement (N) and radio frequency level for the specific frequency;
    scanning a band of frequencies that the specific frequency is part of, and storing a plurality of identified frequencies;
    at least one frequency intemodulation is calculated by the stored plurality of identified frequencies;
    in response to the at least one frequency intermodualtion being not equal to the specific frequency, performing an iterative process to readjust the RF AGC, the interative process including a readjustment of the RF AGC based on a noise floor performance.

2. The method according to claim 1, wherein the computing of the at least one frequency intermodulation ($F_{IMx}$) further comprises defining $F_{IMx}$ by the following relationship:

$$p*f_{u1}+-q*f_{u2},$$

where,
    p is a first number up to x associated with an order of intermodulation,
    q is a second number up to x associated with an order of intermodulation,
    x is a predefined number correlating to a number of orders to be produced,
    $f_{u1}$ and $f_{u2}$ are defined by the plurality of identified frequencies.

3. The method according to claim 2, wherein the iterative process to readjust the RF AGC further comprises:
    determining whether a desired signal strength ($V_d$) is above a predetermined threshold ($V_g$);
    in response to $V_d<V_g$, determining whether the $F_d$ is different than any of $F_{IMx}$ calculated, and in response to $F_d$ being different:
        reducing the RF AGC by a predetermined amount.

4. The method according to claim 3, wherein the iterative process further comprises:
    measuring a noise ($N_1$) after reducing the RF AGC; and
    comparing the $N_1$ with N, and in response $N_1$ being larger than N, increasing the RF AGC by a predetermined amount.

5. The method according to claim 4, wherein the iterative process further comprises:
    in response $N_1$ being smaller than N, equating N as $N_1$; and
    iteratively re-performing the reducing.

6. The method according to claim 4, comprising:
    measuring a noise floor after increasing the RF AGC by a predefined amount ($N_2$);
    comparing $N_2$ and N, and in response to $N_2$ being larger, increasing the RF AGC by a predetermined amount.

7. The method according to claim 1, wherein the method is re-performed after a predetermined delay.

* * * * *